United States Patent [19]

Tamura et al.

[11] Patent Number: 5,266,364
[45] Date of Patent: Nov. 30, 1993

[54] METHOD AND APPARATUS FOR CONTROLLING PLASMA PROCESSING

[75] Inventors: Hitoshi Tamura; Tamotsu Shimizu, both of Yokohama, Japan

[73] Assignee: Hitachi, Ltd., Tokyo, Japan

[21] Appl. No.: 745,328

[22] Filed: Aug. 15, 1991

[30] Foreign Application Priority Data

Aug. 20, 1990 [JP] Japan .................. 2-217049

[51] Int. Cl.⁵ ............... B05D 3/06; C23C 16/00
[52] U.S. Cl. .................. 427/571; 427/575; 427/562; 427/561; 118/723 MA
[58] Field of Search ........ 427/38, 47, 45.1, 39, 427/40, 41, 488, 489, 490, 491, 535, 536, 538, 539, 561, 562, 563, 564, 571, 575, 570; 118/723, 724, 50.1, 723 R, 723 MPL, 723 MW, 723 MWR, 723 MR, 723 MAG, 723 ANT, 723 T, 723 TR; 156/345, 643; 204/192.1, 192.32, 298.16, 298.17, 298.18, 298.19, 298.2, 289.2, 298.37, 298.38

[56] References Cited

U.S. PATENT DOCUMENTS

| | | | |
|---|---|---|---|
| 4,721,553 | 1/1988 | Saito et al. | 204/192.12 |
| 4,727,293 | 2/1988 | Asmussen et al. | 427/39 |
| 4,776,918 | 10/1988 | Otsubo et al. | 156/345 |
| 4,853,102 | 8/1989 | Tateishi et al. | 204/298 |
| 4,876,983 | 10/1989 | Fukuda et al. | 204/298.37 |
| 4,877,509 | 10/1989 | Ogawa et al. | 204/298 |
| 4,948,750 | 8/1990 | Kausche et al. | 118/723 |
| 4,985,109 | 1/1991 | Otsubo et al. | 156/345 |
| 5,032,202 | 7/1991 | Tsai et al. | 204/298.37 |
| 5,061,838 | 10/1991 | Lane et al. | 204/298.37 |
| 5,079,033 | 1/1992 | Schulz et al. | 118/723 MAG |
| 5,111,111 | 5/1992 | Stevens et al. | 118/723 MR |
| 5,122,251 | 6/1992 | Campbell et al. | 118/723 |
| 5,181,986 | 1/1993 | Ohiwa | 427/575 |

FOREIGN PATENT DOCUMENTS

| | | |
|---|---|---|
| 0311696 | 4/1989 | European Pat. Off. . |
| 55-141729 | 11/1980 | Japan . |
| 59-114798 | 7/1984 | Japan . |
| 62-37900 | 2/1987 | Japan . |

OTHER PUBLICATIONS

Okamoto, "Plasma Reaction Apparatus", Patent Abstracts of Japan, vol. 13, #459 (E-126)(832), Oct. 1989 of JPA-1-179,323, Jul. 1989.

Primary Examiner—Marianne Padgett
Attorney, Agent, or Firm—Antonelli, Terry, Stout & Kraus

[57] ABSTRACT

A method and apparatus for controlling plasma generated utilizing microwaves and a magnetic field. Microwaves including right and left circularly polarized waves are generated and introduced into a processing chamber and a ratio of the right circularly polarized waves to the left circularly polarized waves is controlled to enable control of at least one of an electron temperature and a density distribution for plasma processing.

23 Claims, 7 Drawing Sheets

METHOD AND APPARATUS FOR CONTROLLING PLASMA PROCESSING

BACKGROUND OF THE INVENTION

The present invention relates to a method and apparatus for controlling plasmas enabling plasma processing with high quality by controlling parameters for plasmas such as an electron temperature and a density distribution of the plasmas.

A plasma processing apparatus for generating plasmas by introducing microwaves in parallel with a magnetic flux density into a processing chamber applied with a magnetic flux density to such an extent as to cause electron cyclotron resonance has been described in, for example, Japanese Patent Application Laid-Open No. 55-141729.

Plasma processing apparatus using microwaves under a magnetic field have been used generally in recent years since they can generate plasmas at high density even in a high vacuum region and correspond to processing conditions over a wide range. The electron cyclotron resonance phenomenon is utilized in most of such apparatus. The electron cyclotron resonance as discussed herein is a resonance phenomenon that occurs upon coincidence between the frequency of a cyclotron movement of electrons under a static magnetic field and the frequency of microwaves having a wavelength of about 1 cm to 30 cm and it is known that the electric power of the microwaves can be absorbed efficiently into plasmas upon occurrence of the resonance.

In a plasma processing apparatus using a static magnetic field, the density distribution of plasmas has been optimized by adjusting the distribution of the static magnetic field in order to attain uniform processing. However, in a plasma processing apparatus using the electron cyclotron resonance phenomenon, since a static magnetic field having a higher magnetic flux density as compared with usual plasma processing apparatus is used, there has been a problem that the size of an electromagnet for the control of distribution is also increased.

Since the degree of integration for LSI is increasing, it is necessary to make the quality for the plasma processing higher. In compliance with the trend, a technique for controlling the characteristics of plasmas is necessary. The inventors have considered the case of plasma CVD. For instance, in a case of forming a thin Si film by using monosilane as a reaction gas, it has been known that SiHm radicals (m=0-3) in monosilane plasmas play an important role for reactions. Although it is not apparent which radicals, among them, are most important for the film formation, it is considered that if certain radicals can be excited selectively, high quality thin films at high purity with less hydrogen atoms liable to be contained as an impurity in the films can be formed. Since each of the radicals have inherent excitation energy respectively, it is necessary to control an energy given from plasmas to reaction gases in order to form certain radicals selectively. In view of the above, it becomes necessary to control the energy of electrons (electron temperature) that give an energy by collision to the reaction gases. However, in existent plasma CVD apparatus, since the plasma parameters can not directly be controlled, control has been conducted only by the optimization for film forming conditions by adjusting process conditions such as a film-forming pressure or a plasma-confining static magnetic field.

The foregoing requirements are also applicable to a case of plasma etching. That is, for efficiently exciting active species that contribute most to the reactions, it is necessary to control parameters of plasmas such as the density and the electron temperature of plasmas. Further, in a case of bias sputtering film formation, it is known that the coverage ratio for steps and crystallinity of films vary depending on the amount and the energy of ions irradiated to a substrate to be processed during film formation. In a case of wiring films, the coverage ratio for steps and the crystallinity of films are important parameters that determine the life of wirings and it is necessary to control plasmas near the substrate to be processed In order to form wiring films with high quality.

SUMMARY OF THE INVENTION

It is, accordingly, an object of the present invention to provide a method and apparatus for controlling plasma processing to enable control of at least one of an electron temperature and a density distribution for plasma processing.

It is another object of the present invention to enable control of parameters of plasmas such as an electron temperature and a density distribution of plasma by controlling the characteristics of at least two different polarized waves in a case of a plasma processing apparatus using a microwave discharge under a magnetic field.

In accordance with the present invention, for plasma processing, right circularly polarized waves and left circularly polarized waves are introduced into a processing chamber in a direction substantially in parallel with a direction of a static magnetic field and the ratio between the right circularly polarized wave and the left circularly polarized waves in the microwaves is controlled so as to enable control of at least one of an electron temperature and a density distribution for the plasma processing of a substrate provided in the processing chamber.

According to a feature of the present invention, the control of the ratio between the right circularly polarized waves and the left circularly polarized waves is achieved by controlling the angle of rotation of an anisotropic medium in the form of a phase shift plate mounted in a waveguide tube utilized for introducing the microwaves into the plasma processing chamber.

In accordance with another feature of the present invention, the ratio between the right circularly polarized waves and the left circularly polarized waves is controlled by adjusting a pitch of a helical antenna disposed in a mode converter in the portion utilized for introducing the microwaves into the plasma processing chamber.

According to a further feature of the present invention, an anisotropic dielectric plate utilized for converting one of left and right circularly polarized waves into the other of the left and right circularly polarized wave is provided around the substrate which is to be processed in the plasma processing chamber thereby enabling control of the ratio and control of the electron temperature and density distribution for plasma processing.

These and further objects, features and advantages of the present invention will become more obvious from the following description when taken in connection with the accompanying drawings which show for purposes of illustration only, several embodiments in accordance with the present invention.

BRIEF DESCRIPTION OF THE DRAWINGS

FIG. 1 and FIG. 2 illustrate the principle of the present invention, in which

DESCRIPTION OF THE PREFERRED EMBODIMENTS

Referring now to the drawings, the principle of operation of the present invention will be described in connection with FIGS. 1 and 2.

In accordance with the present invention, one of the plasma-controlling parameters that can be adjusted most easily is an amount of energy charged into plasmas. The electron temperature and the plasma density can be increased by increasing the amount of the energy charged. On the other hand, the parameters can be controlled also by varying a positional relationship between plasma generation sources and positions at which the parameters are intended to be controlled. Generally, the electron temperature and the plasma density are lowered in accordance with the separation distance from the plasma generation sources. The degree of reduction is determined depending on the states inherent to the apparatus and the film forming conditions such as diffusion and loss of plasmas. Thus, the parameters of plasmas at any desired position can be controlled by controlling the amount of energy charged in the plasmas and the positional relationship with respect to the plasma generation sources.

For controlling the position of the plasma generation source in a case of using electromagnetic waves as an energy source for plasma generation and for increasing the density of plasmas at a certain position by the charging of electromagnetic waves, it is necessary to propagate the electric power of the electromagnetic waves to the aimed position. The propagation characteristics of the electromagnetic waves in plasmas applied with a static magnetic field in parallel with the advancing direction of the waves are different between right circularly polarized waves and left circularly polarized waves, which can be represented respectively by the formulae (1) and (2).

$$\frac{c^2 k^2}{\omega^2} = 1 - \frac{\omega_p^2/\omega^2}{1 - \omega_o/\omega} \quad \text{(right circularly polarized waves)} \quad (1)$$

-continued $$\frac{c^2 k^2}{\omega^2} = 1 - \frac{\omega_p^2/\omega^2}{1 + \omega_o/\omega} \quad \text{(left circularly polarized waves)} \quad (2)$$

in which
c: velocity of light
k: number of waves
$\omega$: angular frequency of waves
$\omega_p$: angular frequency of plasma oscillations
$\omega_o$: angular frequency of electron cyclotron In a region where the number of waves k takes an imaginary number in the formulae (1) and (2), waves are attenuated in the form of an exponential function as they advance and can not be propagated into plasmas.

Figure 1:
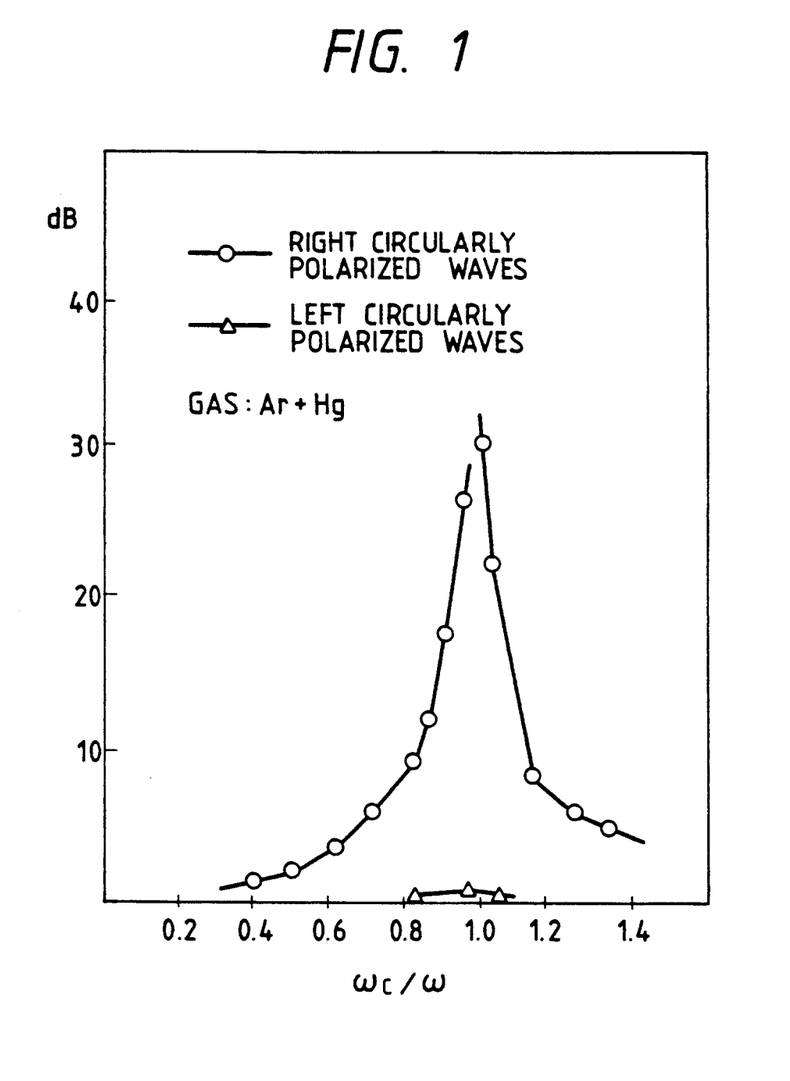
FIG. 1 shows the absorption characteristics of the right circularly polarized waves and the left circularly polarized waves into plasmas.

FIG. 1 shows an example of an experimental study on absorption characteristics of right circularly polarized waves and left circularly polarized waves to plasmas applied with a static magnetic field in parallel with the advancing direction of the waves in a gas environment of Ar+Hg ("Microwave Technology", by Yuichi Sakamoto, Ionics, May 1983). It can be seen from the figure that absorption at about 1 dB occurs near the electron cyclotron resonance frequency with the left circularly polarized waves, whereas absorption at about several tens dB occurs with right circularly polarized waves. The electric power of the electromagnetic waves is used for increasing the plasma density, the electron temperature, etc. of the plasmas at the absorbed positions, and it can be considered that the absorption position is a plasma generation source.

Considering a case of applying electromagnetic waves causing the electron cyclotron resonance to semi-infinite plasmas under a substantially uniform static magnetic field in parallel with the static magnetic field, since the right circularly polarized waves undergo a great attenuation, they are absorbed into plasmas only near the boundary and can not penetrate deeply to the inside, whereas the left circularly polarized waves do not undergo so great attenuation. Accordingly, the left circularly polarized waves can penetrate to the inside of the plasmas and are absorbed over a relatively wide range. The energy of the absorbed electromagnetic waves contributes to the increase of the plasma density.

Figure 2:
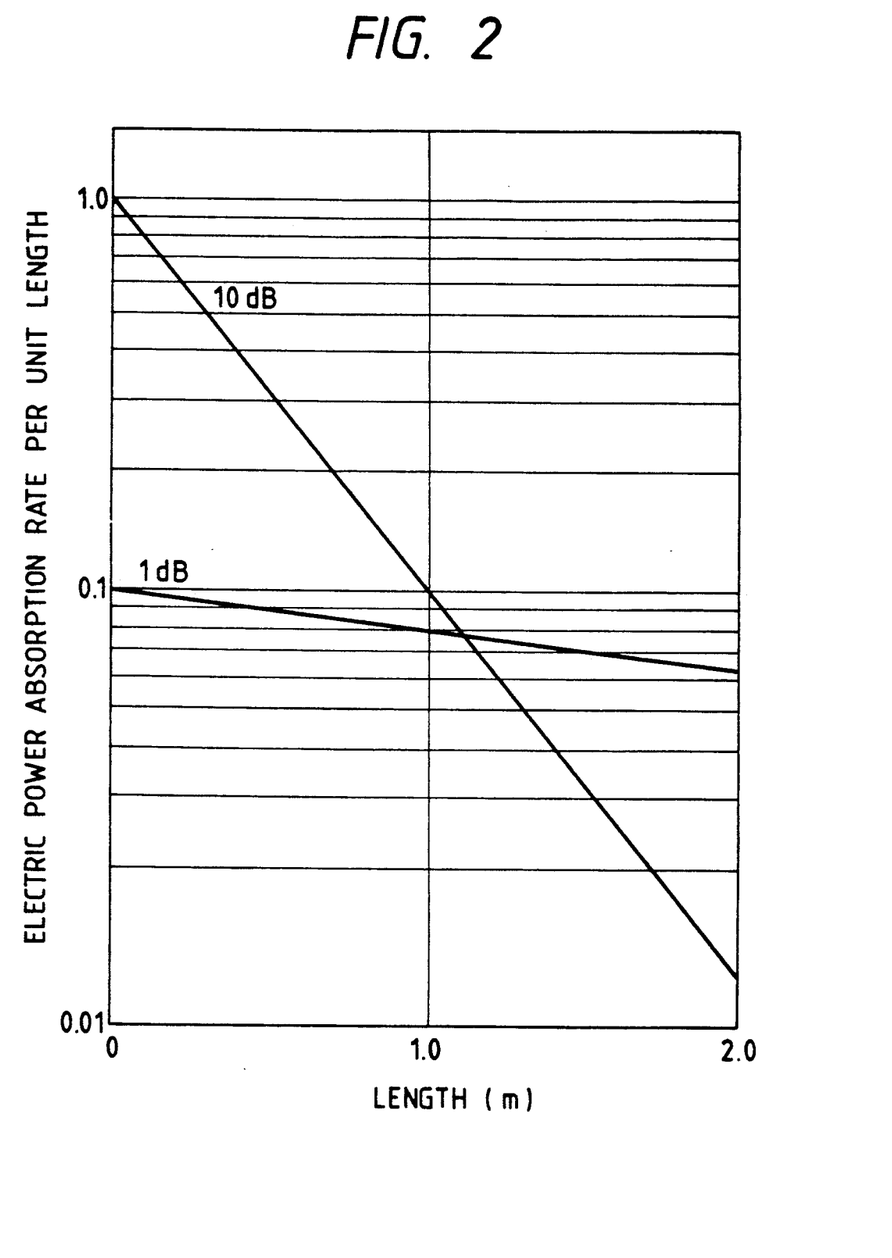
FIG. 2 illustrates electric power absorption to each of the portions of a medium with uniform loss when electromagnetic waves are irradiated thereto.

For quantitative consideration on the control for the distribution of the plasma density depending on the difference of the attenuation amount, FIG. 2 shows an example for the result of a calculation of electric power absorbed in each of the positions in a homogeneous medium with a constant attenuation amount when electromagnetic waves are irradiated to the medium. The abscissa indicates the distance from the end face of the medium. It can be seen that when the attenuation amount in the medium is as small as 1 dB, the absorption of the electric power is small, but it can be absorbed relatively effectively also at the inside of the medium. On the other hand, if the attenuation amount is as large as 10 dB, the energy of the electromagnetic waves is absorbed near the end face of the medium and the waves do not reach deeply to the inside of the medium and, accordingly, the absorption amount is abruptly lowered in accordance with the separation distance from the end face.

Considering a case where the medium is plasmas, since the generation amount of the plasmas is substantially in proportion with the absorption amount of the electric power, the right circularly polarized waves with great attenuation amount contribute to the increase of the plasma density near the plasma end face. On the other hand, in the case of the left circularly polarized waves with low attenuation amount, the electric power of the microwaves can also be absorbed at a position apart from the end face of the plasmas. Accordingly, plasmas can be generated uniformly relative to the advancing direction of the microwaves as compared with the case of the right circularly polarized waves.

Since the wall surface of a plasma processing chamber is usually made of a metal such as Al, it has high electroconductivity and microwave loss is small. Accordingly, even in a case of left regularly polarized waves with low attenuation, microwaves incident in the processing chamber repeat reflections on the wall surface and, finally, most of the microwave power is absorbed into the plasmas.

In accordance with the present invention, the left circularly polarized waves with low attenuation and the right circularly polarized waves with high attenuation are used at the same time so that the distribution of the plasma generation sources in the advancing direction of the waves can be adjusted and the density distribution can be controlled, by controlling the mixing ratio of the left and right circularly polarized waves. That is, while it is possible to attain a density distribution increased locally near the boundary to which the waves are applied to the plasmas in a case of using 100% right circularly polarized wave as described in Japanese Patent Application Laid-Open No. 59-114798, which indicates that the etching speed is increased and etching time reduced, and while it is possible to attain a relatively uniform density distribution relative to the advancing direction of waves in a case of using 100% left circularly polarized waves, in accordance with the present invention, the density distribution can be controlled by supplying both right and left circularly polarized waves and continuously adjusting the mixing ratio between the right and the left circularly polarized waves. Furthermore, more complicated control is also possible by disposing a converter for the right and left polarized waves at the inside of the processing chamber.

A case of a non-uniform static magnetic field can also be considered similarly. The right circularly polarized waves are locally adsorbed at a place met for the first time causing the electron cyclotron resonance phenomenon along with the advance of the waves and the waves are substantially eliminated. The left circularly polarized waves are not completely absorbed at a place met for the first place causing electron cyclotron resonance phenomenon, but are diffused in the processing chamber and absorbed also at other places. The density distribution can be controlled by utilizing the difference therebetween.

As a method of generating circularly polarized waves there can be mentioned, for example, a method of disposing a phase shift plate in a waveguide tube (for example, reference is made to "Microwave Circuit", written by Ishii, Azuma, et al, published Nikkan Kogyo Shinbun Co. (1969)), a method of using a helical antenna (for example, reference is made to Radiowave Engineering" written by Enomoto and Sekiguchi in Modern Electric Technology Lecture, published by Ohm Co., and Japanese Patent Application Laid-Open No. 62-37900). In the method of disposing the phase shift plate, a phase shift plate of a length: $\lambda/4$, ($\lambda$: wavelength in the tube) is disposed in a TE$_{11}$ mode circular waveguide tube, being slanted 45° relative to the electric field, and circularly polarized waves are generated by utilizing the difference of the phase constants between the directions vertical to and parallel with the phase shift plate. The same effect can also be realized by using a material having anisotropy. For instance, there can be mentioned a method of using an anisotropic dielectric material (for example, reference is made to "Analysis for Characteristics of Polarized Waves In a Circular Waveguide Tube Containing an Anisotropic Dielectric Material by a Space Circuit Network Method", Report Journal of Electronic Information and Communication Society: written by Koh, Yoshida and Fukai, C-I, Vol. J71-C-I, No. 8, pp. 460–472). In the method of using the helical antenna, circularly polarized waves are generated by propagating electromagnetic waves in the circumferential direction of a helix with a peripheral length of about 1 wavelength.

Figure 3:
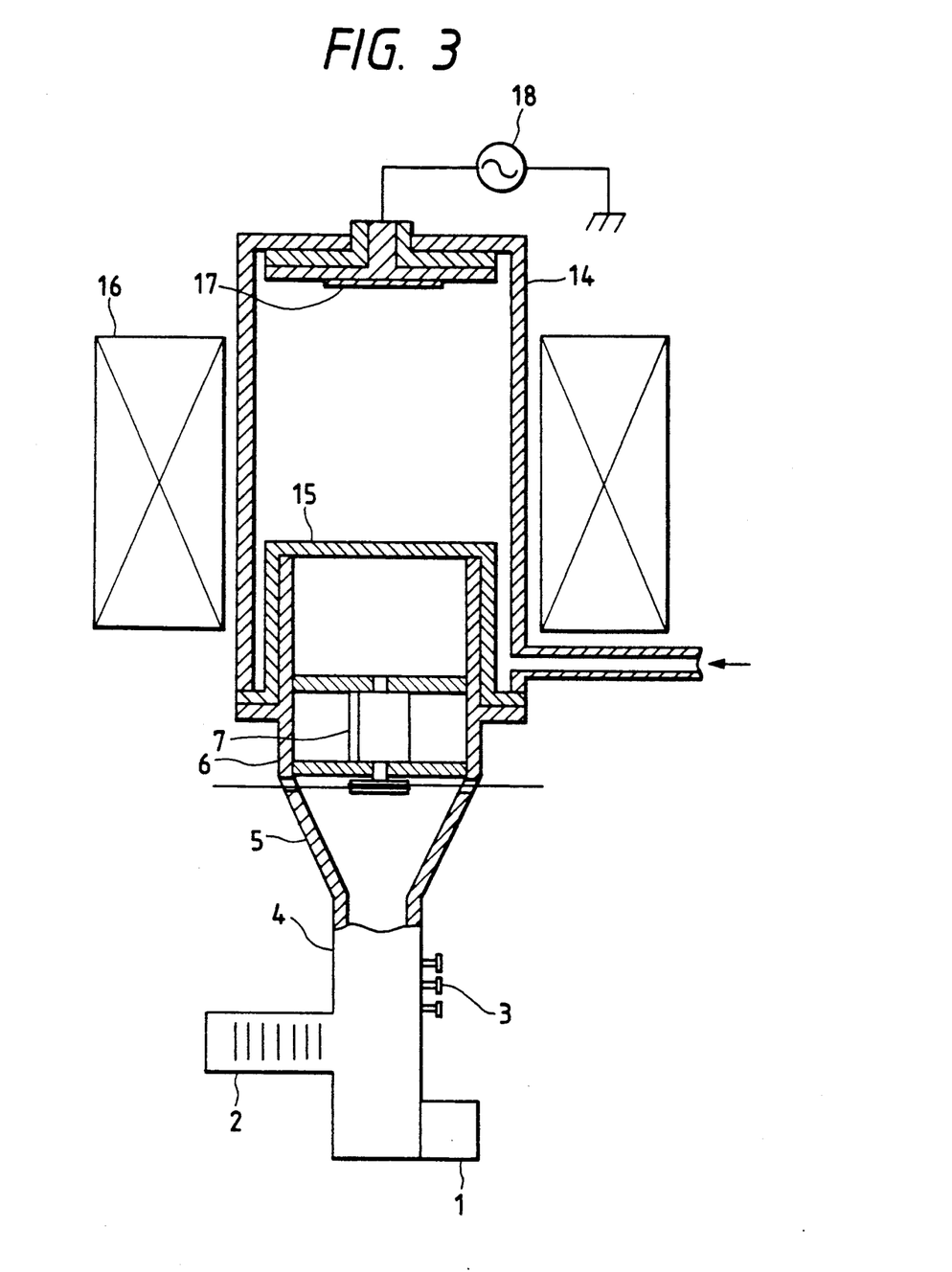
FIG. 3 is a cross sectional view of a CVD apparatus according to one embodiment of the present invention.
Figure 4:
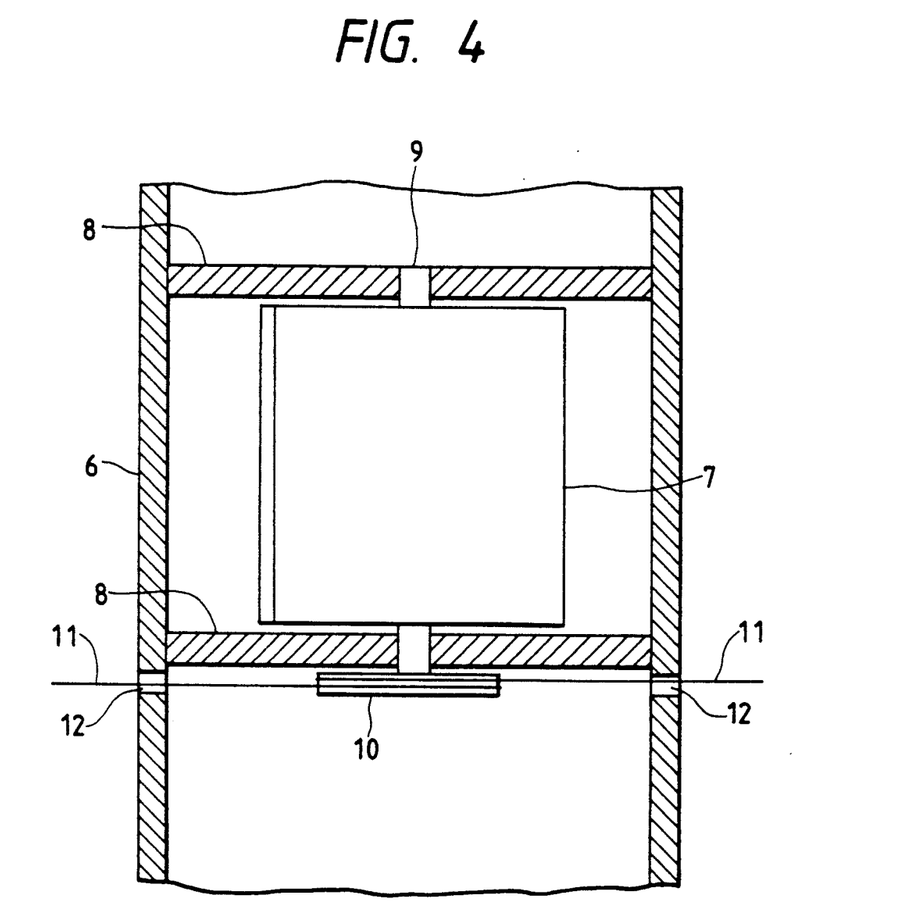
FIG. 4 is an enlarged cross sectional view illustrating the vicinity of a phase shift plate in FIG. 3.

A first embodiment of the present invention is illustrated in FIG. 3 and FIG. 4, wherein FIG. 3 shows a CVD apparatus in which a phase shift plate 7 is used for controlling the characteristics of polarized waves. The same reference numerals are utilized in the other drawings to designated like parts. A processing chamber 14 is kept at a predetermined pressure by an introduction system for a processing gas and a vacuum evacuation system (not shown). A static magnetic field providing a magnetic flux density for generating an electron cyclotron resonance phenomenon in the processing chamber 14 is applied to the processing chamber 14 by an electromagnet 16.

Microwaves are transmitted from a microwave generation source 1 by way of an isolator 2, a matching device 3 and a square waveguide tube 4 and then converted by a mode converter 5 into a TE$_{11}$ mode of a circular waveguide tube 6. The phase shift plate 7 made of a dielectric material is mounted in the circular waveguide tube 6 so as to be rotatable about a central axis of the tube 6. The ratio between the right circularly polarized waves and the left circularly polarized waves in the microwaves is controlled by controlling the angle of rotation of the phase shift plate 7. Between the processing chamber 14 and the circular waveguide tube 6, a microwave introduction window 15 made of a dielectric material with low microwave loss such as quartz is disposed for introducing microwaves while keeping the inside of the processing chamber 14 at an appropriate pressure for the processing. The advancing direction of the microwaves is substantially in parallel with the direction of the static magnetic field provided by the electromagnet 16. A substrate 17 which is to be processed is disposed opposite to the microwave introduction window 15 and high frequency waves are applied from a frequency power source 18 to the substrate 17.

FIG. 4 shows an enlarged view of a portion of the apparatus of FIG. 3 in the vicinity of the circular waveguide tube 6. Support members 8 made of a dielectric material with low loss, for example, quartz, are disposed in the circular waveguide tube 6 for supporting the phase shift plate 7. A shaft 9 is passed through the center of the phase shift plate 7 and a disc 10 is connected to one end of the shaft 10. A thread 11 is wound around the disc 10 and is led out of the circular waveguide tube 6 through a small aperture 12. By pulling the thread 11, the disc 10 is rotated thereby enabling adjustment of the angle of the phase shift plate 7 relative to an electric field.

When an angle of the shift plate 7 relative to the electric field is 0°, linearly polarized waves are formed. When the angle is 45°, circularly polarized waves are formed. Elliptically polarized waves are formed at an angle between 0° and 45°. That is, the ratio of the right circularly polarized waves and the left circularly polarized waves can be controlled by adjusting the angle of the phase shift plate 7 relative to the electric field within a range from 0° to 45°.

By using the plasmas generated by the microwaves, reactions of processing gases can be promoted to enable film-forming processing at a high speed. Further, by adjusting the characteristics of the polarized waves in the microwaves and the electric power of the microwaves, films can be formed on the substrate 17 while controlling the electron temperature and the density distribution of the plasmas so as to be optimized for formation of the films.

Figure 5:
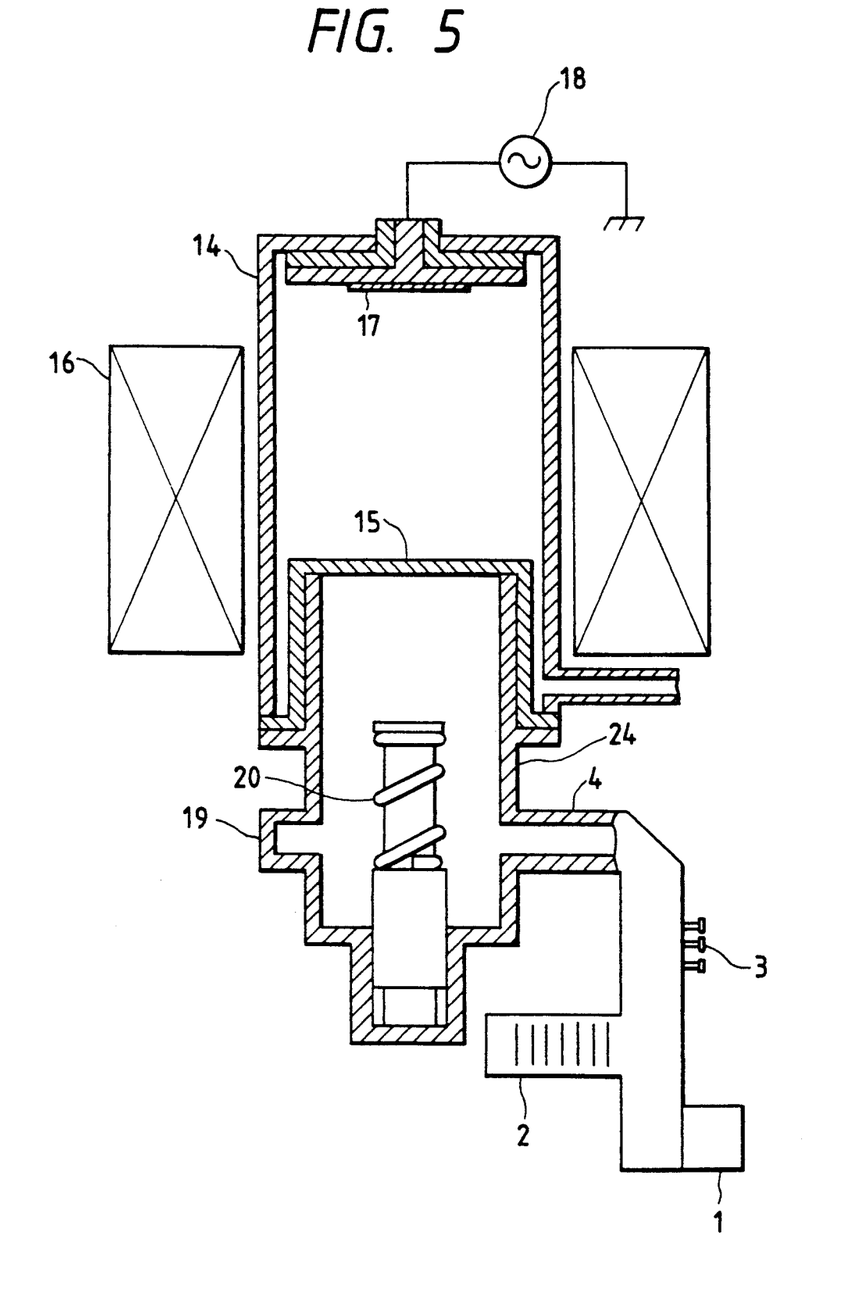
FIG. 5 is a cross sectional view of a CVD apparatus according to another embodiment of the present invention.
Figure 6:
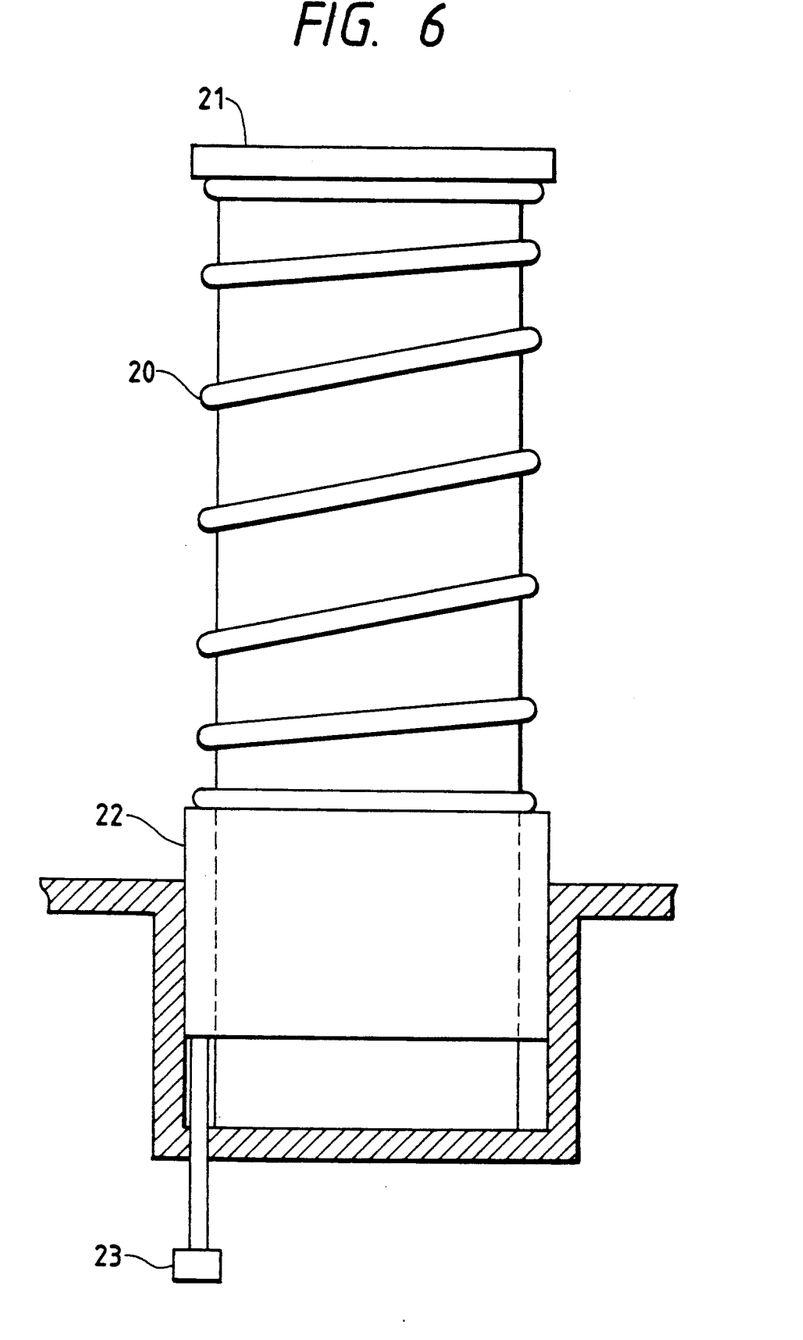
FIG. 6 is an enlarged cross sectional view illustrating the vicinity of a helical antenna in FIG. 5.

A second embodiment is illustrated in FIG. 5 and FIG. 6, wherein FIG. 5 shows a CVD apparatus for practicing the present invention in which a helical antenna is used for controlling the characteristics of polarized waves. This embodiment has the same general construction as the first embodiment except that a portion of the microwave circuit is different.

Microwaves are transmitted from the microwave generation source 1 by way of the isolator 2, the matching device 3 and the square waveguide tube 4 to a mode converter 19. A helical antenna 20 having a variable pitch is disposed in the mode converter 19, which enables generation of circularly polarized waves. The circularly polarized waves generated are charged by a circular waveguide tube 24 through the microwave introducing window 15 into the processing chamber 14.

FIG. 6 shows an enlarged view of a portion of FIG. 5 in the vicinity of the helical antenna 20. The helical antenna 20 is made of a metal material with high electroconductivity, for example, copper. Further, the helical antenna 20 is held by a columnar helix support member made of a dielectric material with low microwave loss, for example, quartz, and having a flange at the top end. The helix support member 21 is further attached with a ring-like members 22. It is possible to adjust the entire length of the helical antenna 20 and to adjust the pitch of the helical antenna 20 by operating a knob 23 connected to the ring-like member 22 thereby displacing the position of the ring-like member 22 in parallel with the axis of the helix support member 21 It has been known that circularly polarized waves can be formed when the pitch of the helical antenna 20 is about 1/10 to ½ of the wavelength (see for example, "Radiowave Engineering", Modern Electric Engineering Technology Lecture, written by Enomoto and Sekiguchi, published by Ohm Co.). As the pitch of the helical antenna 20 is reduced, the inter-line capacity is increased to make the electromagnetic coupling stronger between the lines, by which the helical antenna operates in a manner proximate to that of a metal column relative to the microwaves. Considering a case in which the helical antenna 20 is replaced with a metal column, the microwaves are formed as linearly polarized waves. In view of the above, as the pitch of the helical antenna 20 is reduced, the microwaves are changed from the circularly polarized waves to the linear polarized waves, thereby enabling control of the characteristics of the polarized waves by operating the knob 23 so as to control the mixing ratio of the right and left circularly polarized waves. Also in this embodiment, the quality of the films formed on the substrate 17 which is to be processed can be enhanced by controlling the electron temperature and the density distribution of the plasmas like that in the first embodiment.

Figure 7:
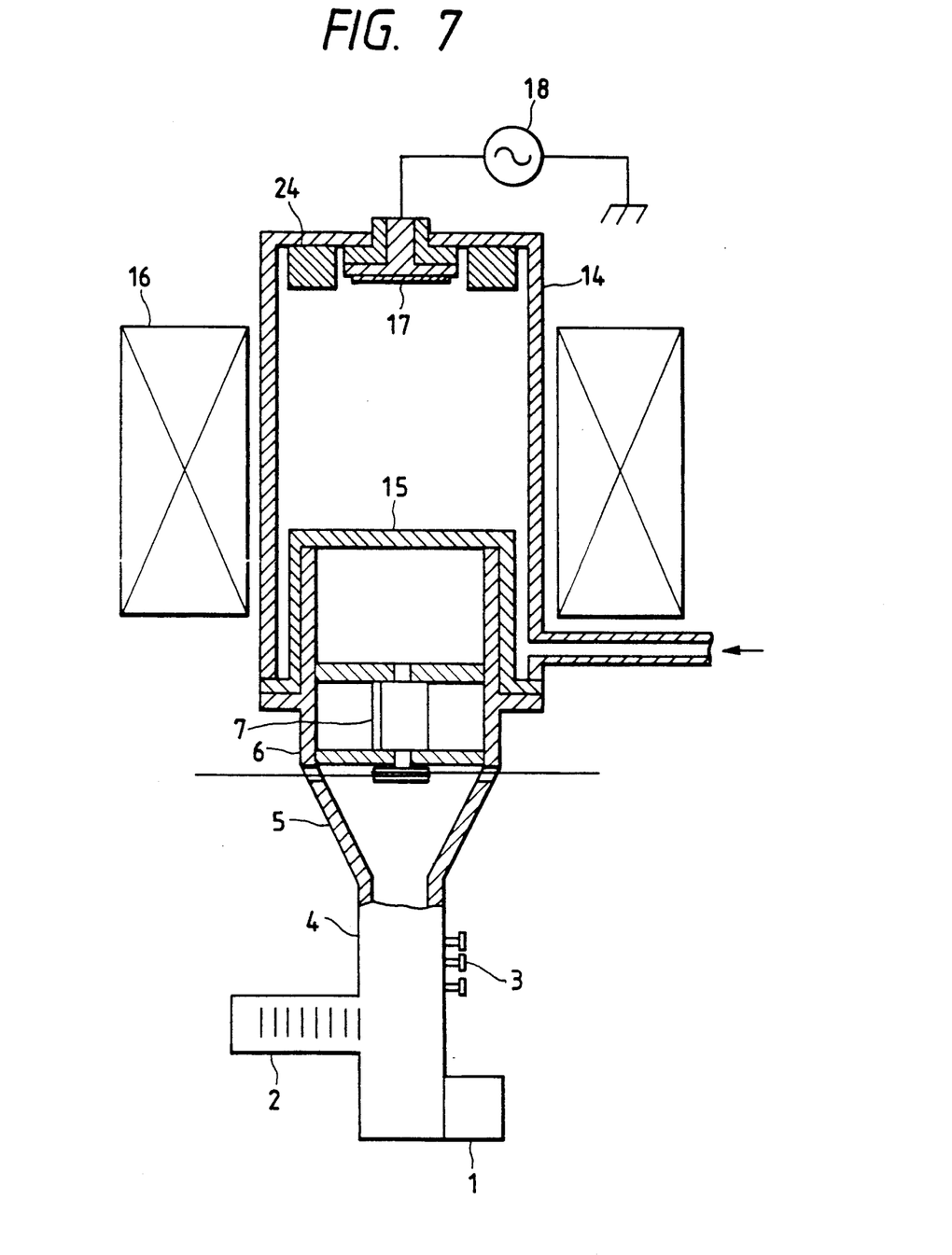
FIG. 7 is a cross sectional view of a CVD apparatus according to a further embodiment of the present invention.

A third embodiment of the present invention is illustrated in FIG. 7 which shows a CVD apparatus having a construction as shown in FIG. 3, and additionally utilizing an anisotropic dielectric plate 24 for converting left circularly polarized waves into right circularly polarized waves and disposed around the substrate 17 which is to be processed.

Among the microwaves introduced by way of the microwave introducing window 15 into the processing chamber 14, right circularly polarized waves with high attenuation in plasmas are absorbed near the microwave introducing window 15 to increase the plasma density at the vicinity thereof. On the other hand, left circularly polarized waves with low attenuation are propagated to the vicinity of the anisotropic dielectric plate 24. In this case, the left circularly polarized waves are converted into right circularly polarized waves, which contribute to the increase of the plasma density near the substrate 17.

By controlling the ratio of the right circularly polarized waves and the left circularly polarized waves in the microwaves charged into the processing chamber 14, the amount of plasmas generated near the microwave introduction window 15 and the anisotropic dielectric plate 24 can be controlled to thereby control the distribution of the plasma density in the processing chamber 14. Also in this example, the electron temperature and the density distribution of the plasmas can be controlled so as to be optimized for the formation of films in a manner similar to that in the first and the second embodiments.

In addition, other conversion devices such as a helical antenna for conversion from the left circularly polarized waves to the right circularly polarized waves may be utilized instead of the anisotropic dielectric plate 24.

Although the above descriptions of the first, second and third embodiments have been directed to utilization of the CVD apparatus as an example of the present invention, the present invention can also be applied to other plasma processing apparatus such an etching apparatus, an ashing apparatus and a sputtering apparatus.

Since plasma parameters such as the electron temperature and the density distribution of plasmas in the plasma processing can be controlled by controlling the mixing ratio of right and left circularly polarized waves to obtain plasmas optimized for the plasma processing, plasma processing can be conducted with high quality.

While we have shown and described several embodiments in accordance with the present invention, it is understood that the same is not limited thereto but is susceptible of numerous changes and modifications as known to those skilled in the art and we therefore do not wish to be limited to the details shown and described herein but intend to cover all such changes and modifications as are encompassed by the scope of the appended claims.

What is claimed is:

1. A method for controlling a plasma generated utilizing microwaves and a magnetic field, comprising the steps of:
   generating microwaves having an initial ratio of first and second differently polarized waves; and
   changing the initial ratio of first and second differently polarized waves to another ratio of first and second differently polarized waves at least prior to generation of a plasma by interaction of the another ratio of waves and the magnetic field so as to control at least one of an electron temperature and a density distribution for plasma processing.

2. A method according to claim 1, wherein the plasma processing is CVD plasma processing.

3. A method according to claim 1, wherein the first polarized waves are right circularly polarized waves and the second polarized waves are left circularly polarized waves and a circular waveguide tube is utilized for generating the right and left circularly polarized waves.

4. A method according to claim 3, wherein the step of changing the initial ratio includes utilizing at least one member disposed within at least one of a microwave introducing part for introducing the microwaves into a processing chamber, and the processing chamber.

5. A method according to claim 4, wherein the at least one member is controllable and includes a phase shift plate disposed in and rotatable about a center axis of the circular waveguide tube forming a portion of the microwave introducing part, the step of changing the initial ratio includes positioning an angle of rotation of the phase plate with respect to the center axis of the circular waveguide tube.

6. A method according to claim 4, wherein the at least one member is controllable and includes a helical antenna having a variable pitch disposed in the microwave introducing part, and the step of changing the initial a ratio includes varying the pitch of the helical antenna.

7. A method according to claim 4, wherein the member includes at least partially a dielectric material disposed within at least one of a waveguide channel of the microwave introducing part and the processing chamber.

8. A method according to claim 7, wherein the dielectric material is a dielectric plate disposed in the processing chamber around a substrate to be processed.

9. A method according to claim 7, wherein the changing of the initial ratio to the another ratio is carried out prior to introducing the first and second differently polarized waves into a plasma processing chamber.

10. A plasma processing method comprising the steps of:
generating microwave having an initial ratio of first and second differently polarized waves along a first direction;
changing the initial ratio of first and second polarized waves to another ratio of first and second differently polarized waves prior to generation of a plasma by interaction of the another ratio of waves and the magnetic field so as to control at least one of an electron temperature and a density distribution for plasma processing; and
applying a static magnetic field substantially in parallel with an advancing direction of the first and second differently polarized waves after changing the initial ratio so as to generate the plasma.

11. A method according to claim 4, wherein the plasma processing is CVD plasma processing.

12. A method according to claim 10, wherein the step of generating includes separating right circularly polarized waves and left circularly polarized waves as the first and second differently polarized waves, respectively, utilizing a circular waveguide tube, and the step of changing the initial ratio includes utilizing at least one member disposed within at least one of the a microwave introducing part for introducing the microwaves into a processing chamber and the processing chamber.

13. A method according to claim 12, wherein the at least one member is controlled and includes a phase shift plate disposed in and rotatable about a center axis of the circular waveguide tube forming a portion of the microwave introducing part, the step of changing the inter ratio includes positioning an angle of rotation of the phase plate with respect to the center axis of the circular waveguide tube.

14. A method according to claim 12, wherein the at least one member is controllable and includes a helical antenna having a variable pitch disposed in the microwave introducing part, and the step of changing the initial ratio includes varying the pitch of the helical antenna.

15. A method according to claim 12, wherein the member includes at least partially a dielectric material disposed within at least one of a waveguide channel of the microwave introducing part and the processing chamber.

16. A method according to claim 15, wherein the dielectric material is a anisotropic dielectric plate disposed in the processing chamber around a substrate to be processed.

17. A plasma processing apparatus for controlling a plasma generated utilizing microwaves and a magnetic field, comprising:
means for generating microwaves having an initial ratio of first and second differently polarized waves; and
means for changing the initial ratio of first and second differently polarized waves to another ratio of first and second differently polarized waves at least prior to generation of a plasma by interaction of the another ratio of waves and the magnetic field, so as to control at least one of an electron temperature and a density distribution for plasma processing.

18. An apparatus according to claim 17, wherein the means for changing the initial ratio to the another ratio effects the changing prior to introducing the first and second differently polarized waves into a plasma processing chamber.

19. An apparatus according to claim 17, wherein the means for generating the microwaves includes means for separating right and left circularly polarized waves as the first and second differently polarized waves, respectively, utilizing a circular waveguide tube, and the means for changing the initial ratio includes at least one member disposed at least one of within a microwave introducing part and within a processing chamber for effecting control of the another ratio.

20. An apparatus according to claim 19, wherein the at least one member is controllable and includes a phase shift plate disposed in and rotatable about a center axis of the circular waveguide tube forming a portion of the microwave introducing part, the means for changing the initial ratio to the another ratio including mans for positioning the angle of rotation of the phase plate with respect to the center axis of the circular waveguide tube.

21. An apparatus according to claim 19, wherein the at least one member is controllable and includes a helical antenna having a variable pitch disposed in the microwave introducing part, and the means for changing the initial ratio to the another ratio includes means for varying the pitch of the helical antenna.

22. An apparatus according to claim 19, wherein the at least one member includes at least partially a dielectric material disposed within at least one of a waveguide channel of the microwave introducing part and within the processing chamber.

23. An apparatus according to claim 22, wherein the dielectric material is a dielectric plate disposed is the processing chamber around a substrate to be processed.

* * * * *